US005473560A

United States Patent [19]
Harada

[11] Patent Number: 5,473,560
[45] Date of Patent: Dec. 5, 1995

[54] METHOD OF READING DATA AND READ-ONLY MEMORY CIRCUIT

[75] Inventor: Teruhiro Harada, Tokyo, Japan

[73] Assignee: Oki Electric Industry Co., Ltd., Tokyo, Japan

[21] Appl. No.: 420,433

[22] Filed: Apr. 10, 1995

Related U.S. Application Data

[63] Continuation of Ser. No. 193,138, Feb. 14, 1994, abandoned filed as PCT/JP93/00882, Jun. 28, 1993.

[30] Foreign Application Priority Data

Jun. 29, 1992 [JP] Japan ..................... 4-170635

[51] Int. Cl.[6] ............................ G11C 17/00; G11C 17/12
[52] U.S. Cl. ................ 365/104; 365/189.01; 365/189.09
[58] Field of Search ........................ 365/189.01, 189.09, 365/94, 104, 103

[56] References Cited

U.S. PATENT DOCUMENTS

| | | | |
|---|---|---|---|
| 4,805,143 | 2/1989 | Matsumoto | 365/104 |
| 4,811,301 | 3/1989 | Houston | 365/104 X |
| 5,020,026 | 5/1991 | Schreck et al. | |
| 5,132,933 | 7/1992 | Schreck | 365/104 X |
| 5,202,848 | 4/1993 | Nakagawara | 365/104 |

FOREIGN PATENT DOCUMENTS

| | | |
|---|---|---|
| 2-210694 | 8/1990 | Japan . |
| 4-74395 | 3/1992 | Japan . |

Primary Examiner—David C. Nelms
Assistant Examiner—Son Mai
Attorney, Agent, or Firm—Edward D. Manzo

[57] ABSTRACT

In a method of reading data comprising the steps of selecting a given column line and a bit line adjoining to the column line among a plurality of column lines (102-1~102-3) and bit lines (101-1, 101-2)based on column selection signals ($Y_1$~$Y_3$), selecting a given row line among a plurality of row lines (103-1~103-n) based on row selection signals ($X_0$~$X_n$) and reading out data which is stored in memory cells (104-01~104-n4) each of which is coupled to the given column line and the row line to the selected bit line, the given column line is set at a first potential level (a potential level supplied by a voltage regulator circuit 160) and almost at the same time the selected bit line is set at a second potential level (a potential level supplied by a sense amplifier circuit 150) which is lower than the first potential level and unselected column lines are set at a third potential level (ground potential level or a potential level supplied by the potential supply circuit 190) which is lower than the second potential level to read out data. As a result, it is possible to perform a high-speed data reading. Moreover, it is possible to realize low power consumption since there flows no useless current at a standby state.

14 Claims, 4 Drawing Sheets

METHOD OF READING DATA AND READ-ONLY MEMORY CIRCUIT

This is a continuation of application Ser. No. 08/193,138, filed on Feb. 14, 1994 now abandoned, which is based on International Application PCT/JP93/00882 filed on Jun. 28, 1993 and which designated the U.S.

TECHNICAL FIELD

The present invention relates to a read-only memory circuit (ROM circuit) such as an erasable programmable read-only memory (EPROM).

BACKGROUND

There are known in general a NAND type and a NOR type as a memory cell system of the ROM circuit. The NOR type is more effective than the NAND type in respect of high-speed reading but is larger than the latter in respect of the occupying area of the memory cell.

There is currently proposed a virtually grounded type memory array (Virtual GND Memory Array) system which is an improved NOR type.

However, in the ROM of the prior art Virtual GND Memory Array system, an inner voltage regulator circuit needs to be operating even in a standby state, which results in consumption of much power.

Such a ROM circuit is disclosed in e.g. Japanese Patent Laid-Open Publication No. 1-259556 as published in Oct. 17, 1989 and No. 4-74395 as published in Mar. 9, 1992.

It is an object of the invention to provide a method of reading data at high speed with low power consumption and a ROM circuit capable of reading data at high speed with low power consumption.

DISCLOSURE OF THE INVENTION

To achieve the above object, in a method of reading data according to a first aspect of the invention comprising the steps of selecting a given column line and a bit line which adjoins to the column line among a plurality of column and bit lines in response to a column selection signal, selecting a given row line among a plurality of row lines in response to a row selection signal, and reading out data which is stored in a memory cell connected to the given column and row lines to the selected bit line;

data is read out from the memory cell by setting the given column line to be at a first potential level and almost at the same time by setting the selected bit line to be at a second potential level which is lower than the first potential level and setting unselected column lines at a third potential which is lower than the second potential.

As a result, it is possible to realize a high-speed reading with low power consumption.

Moreover, to achieve the above object, a read-only memory circuit according to a second aspect of the present invention comprises a plurality of column lines, a plurality of bit lines arranged with the column lines in turns in parallel thereto, a plurality of row lines arranged substantially at right angles to the bit and column lines, a plurality of memory cells for storing data therein, each memory cell having a control terminal coupled to the row lines and being coupled between the column lines and the bit lines, a row selection circuit for selecting a given row line among the plural row lines, a column selection circuit for selecting a given column line among the plural column lines and the bit line adjoining to the selected column line to read out data stored in the memory cell which is coupled to the selected row and column lines, a first potential supply circuit for applying a first potential to the selected column line, a second potential supply circuit for applying a second potential which is lower than the first potential to the selected bit line and a third potential supply circuit for applying a third potential which is lower than the second potential to unselected column lines.

As a result, it is possible to realize a read-only memory circuit which operates at high speed with low power consumption.

BEST MODE FOR CARRYING OUT THE INVENTION

Figure 1:
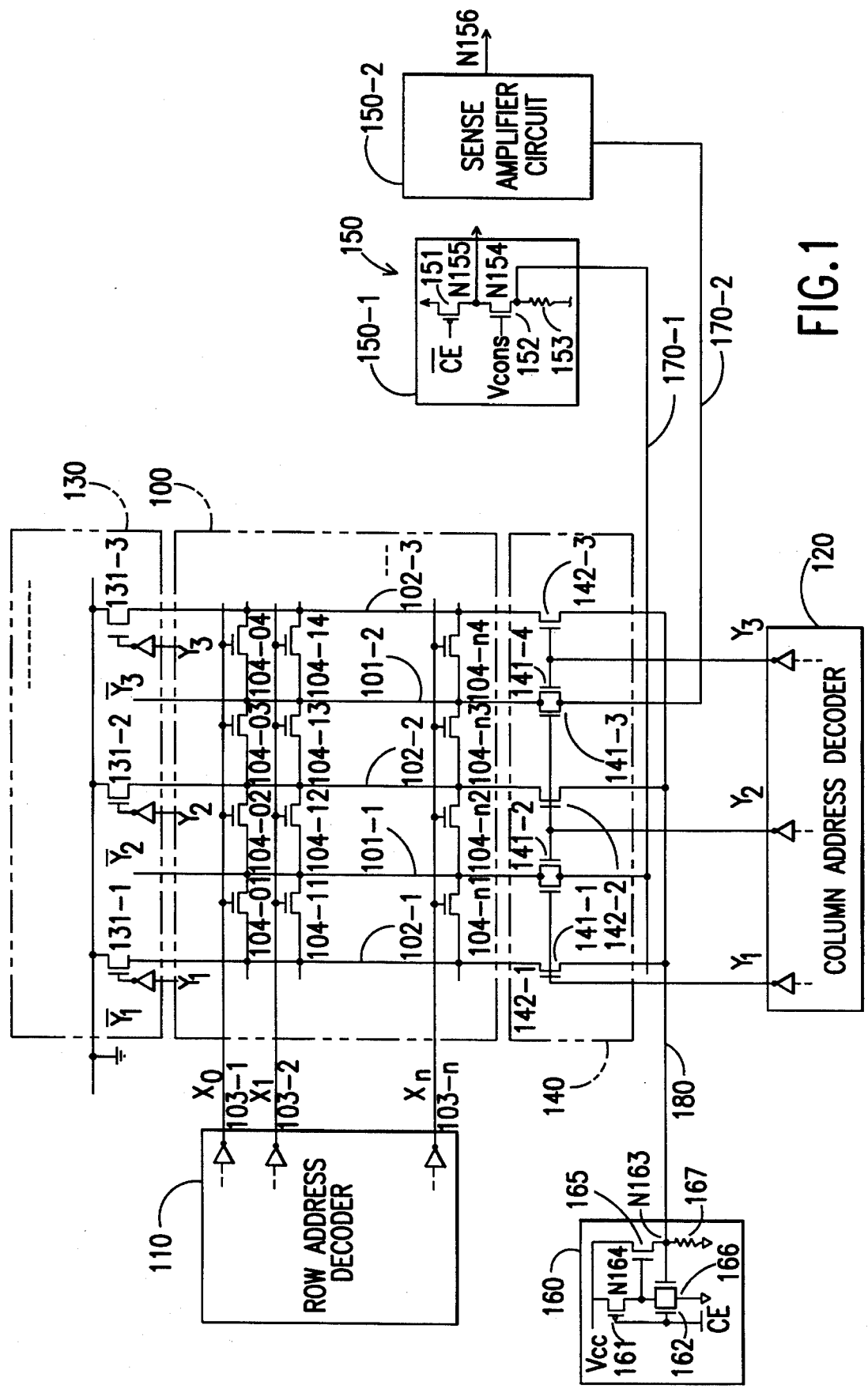
FIG. 1 is a block diagram of a main portion of a ROM circuit according to a first embodiment of the present invention.
Figure 2:
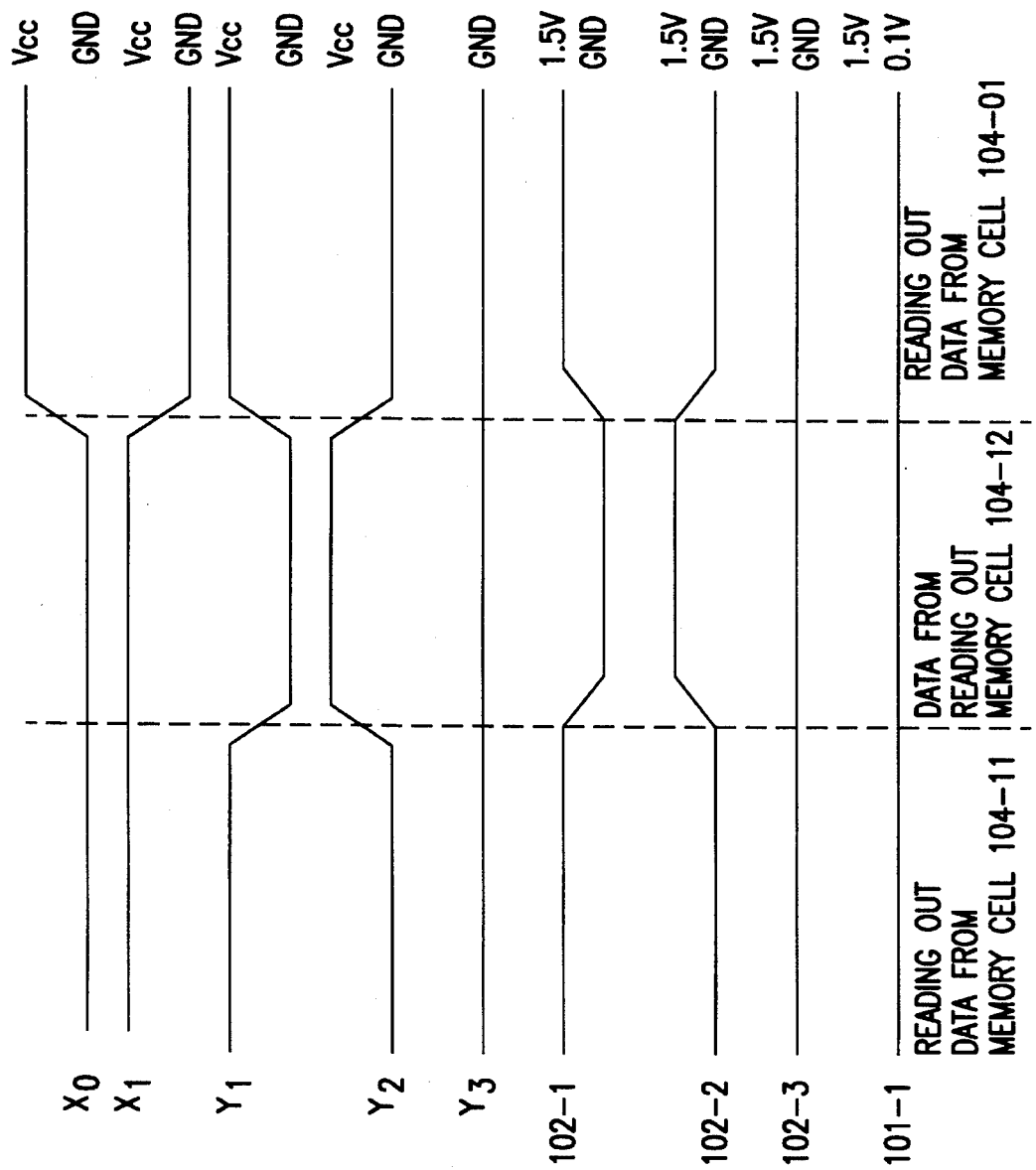
FIG. 2 is a timing chart showing the operation of the ROM circuit illustrated in FIGS. 1 and 2 and FIG. 4 is a block diagram of a ROM circuit according to a third embodiment of the present invention.

FIG. 1 is a block diagram of a read-only memory circuit (referred to as a ROM circuit hereinafter) according to a first embodiment of the present invention. The ROM circuit is equipped with a memory matrix 100, a row address decoder 110 serving as a row selection means, a column address decoder 120 serving as a column selection means, a pull-down circuit 130, a multiplexer 140, a sense amplifier circuit 150 and an inner voltage regulator circuit 160.

The memory matrix 100 is a circuit for storing data therein. The memory matrix 100 comprises bit lines 101-1 and 101-2 and column lines 102-1, 102-2 and 102-3, the bit and column lines being arranged in turns, and row lines 103-1 to 103-n arranged substantially at right angles to the bit and column lines. Memory cells 104-01 to 104-04, 104-11 to 104-14, . . . , 104-n1 to 104-n4 composed of n-channel MOS transistors (referred to as NMOS hereinafter) are provided between each adjacent pair of bit lines 101-1 and 101-2 and column lines 102-1, 102-2 and 102-3. Each of the memory cells 104-01 to 104-n4 is coupled to each corresponding column line of the column lines 102-1 to 102-3 at the source electrode thereof (referred to simply as a source hereinafter), to each of the bit lines 101-1 and 101-2 at the drain electrode thereof (referred to simply as a drain hereinafter) and to each corresponding row line of the row lines 103-1 to 103-n at the gate electrode thereof (referred to simply as a gate hereinafter).

The row address decoder 110 is coupled to the row lines 103-1 to 103-n. The row address decoder 110 decodes a row address signal inputted thereto and supplies a plurality of row selection signal $X_0$ to $X_n$ to the row lines 103-1 to 103-n respectively.

Only a row line among the row lines 103-1 to 103-n is selected by the selection signals $X_0$ to $X_n$.

The column address decoder 120 is a circuit which decodes the column address signal inputted thereto and produces a plurality of column selection signals $Y_1$ to $Y_3$ for selecting the bit lines 101-1 and 101-2 and the column lines 102-1 to 102-3.

The multiplexer 140 is a circuit which is coupled to the bit lines 101-1 and 101-2 and the column lines 102-1 to 102-3 and selects one of the pairs of the bit lines 101-1 and 101-2 and the column lines 102-1 to 102-3 based on the column selection signals $Y_1$ to $Y_3$. The multiplexer 140 is composed of a plurality of switching NMOSs 141-1 to 141-4 and NMOSs 142-1 to 142-3. Each switching NMOSs 141-1 to 141-4 are respectively turned on or off by the column selection signals $Y_1$, $Y_2$ and $Y_3$. Among them the NMOSs 141-1 and 141-2 are coupled between the bit lines 101-1 and a data bus 170-1. The NMOSs 141-3 and 141-4 are coupled between the bit line 101-2 and a data bus 170-2. The NMOSs 142-1 to 142-3 are respectively turned on or of by the column selection signals $Y_1$, $Y_2$ and $Y_3$, and are coupled between the column lines 102-1 to 102-3 and GND (ground) respectively.

The pull-down circuit 130 is composed of NMOSs 131-1 to 131-3 which are respectively coupled to the column lines 102-1 to 102-3. Each NMOS is coupled to GND (ground) at the source thereof. The NMOSs 131-1 to 131-3 receive the inversed signals $\overline{Y}_1$, $\overline{Y}_2$ and $\overline{Y}_3$ of the column selection signals $Y_1$, $Y_2$ and $Y_3$ respectively at the gates thereof.

The inner voltage regulator circuit 160 is coupled to the column lines 102-1 to 102-3 by way of the multiplexer 140. The inner voltage regulator circuit 160 comprises a CMOS inverter composed of a p-channel MOS transistor (referred to as PMOS hereinafter) 161 and an NMOS 162 coupled between $V_{cc}$ (power source) and GND (ground) in series, an NMOS 165 which is coupled between $V_{cc}$ and an inner output node N 163 and the gate of which is coupled to the output node N 164 of the inverter, an NMOS 166 which is coupled between the node N 164 and GND and the gate of which is coupled to the output node N 163 and a high resistant element 167 coupled between the output node N 163 and GND. An inner control signal $\overline{CE}$ for controlling the standby-state/operating-state in reading out data is supplied to the input terminal of the CMOS inverter, i.e., to the gates of the PMOS 161 and the NMOS 162.

In case of a nonvolatile memory having memory cells in which data can be electrically written, the data is sometimes wrongly written or lost when an excessive voltage is applied between the source and drain of the memory cell. Accordingly, the output voltage is designed to be on the order of 1.5 V according to this embodiment, but in case of a mask ROM etc., the power source $V_{cc}$ can be employed instead of a built-in constant voltage source. Moreover, the inner voltage regulator circuit is not limited to that described in this embodiment, but can be anything which can produce a potential excepting the GND level.

The sense amplifier circuit 150 is a circuit which amplifies a change in potential in the data bus 170 and outputs the same.

The sense amplifier circuit 150-1 thereof is composed of a first resistor element 153 coupled between a sense input node N 154 and GND, an NMOS 152 which is coupled between a sense output node N 155 and a sense input node N 155 and the gate of which is coupled to a power source $V_{cons}$ which supplies a constant voltage thereto and a PMOS 151 which is coupled between $V_{cc}$ and the output node N 155 and the gate of which receives the control signal $\overline{CE}$.

The sense amplifier circuit 150-2 is the same as the sense amplifier circuit 150-1 in circuit arrangement. The sense input node is coupled to the data bus 170-2 to amplify a change in potential in the data bus 170-2 and supplies the same to a sense output node N156.

In the sense amplifier circuit 150, the resistor values of the first resistor element 153, the PMOS 151 when it is turned on and the NMOS 152 when it is turned on are set so that the sense input may be about 0.1 V. This setting has the following two merits. The first is that the sense input at the expected value "H" or "L", i.e., the amplitude of the potential in the bit lines can be made small since the input impedance of the sense amplifier circuit can be made small. That is, it is advantageous in high-speed access since the time for charging and discharging the bit lines having a capacitance of several PFs can be shortened in reading operation. The second is that it does not influence the current in the selected memory cell. In this system, when the bit lines are raised in potential, the current flowing in the memory cell when it is turned on is reduced since the potential of the bit lines is that of the source of the selected memory cell, so that, the superiority over the conventional system is lost. Accordingly, the potential of the selected bit line is set to be as close to 0 V as possible in order to obtain a memory cell current substantially as much as in the conventional system.

In the ROM circuit having such an arrangement set forth above, the reading operation of the data bus 170-1 system coupled to the sense amplifier circuit 150-1 by way of the memory cells 104-01, 104-02, 104-11 and 104-12 will be described with reference to the signal waveform diagram illustrated in FIG. 3. the data bus 170-2 system may be considered to operate in the same way.

It is supposed that data is written in the memory cells 104-02, 104-11 and 104-12 in such a way as to make the threshold value $(V_\tau)$ lower than the $V_{cc}$ level (power source potential level), while in the memory cell 104-01 in such a way as to make the threshold value higher than the $V_{cc}$ level.

A case where the address signal varies while the control signal $\overline{CE}$ is at "L" level, i.e., in an operating state will be described at first.

In case the memory cell 104-11 is selected, the row selection signal $X_1$ and the column selection signal $Y_1$ are at $V_{cc}$ level and the row selection signals $X_0$, $X_2$ to $X_n$ and the column selection signals $Y_2$ and $Y_3$ are at GND level. At that time, the inverse signals $\overline{Y}_2$ and $\overline{Y}_3$ of the column selection signals $Y_2$ and $Y_3$ are at $V_{cc}$ level and $\overline{Y}_1$ of the column selection signal $Y_1$ is at GND level. As a result, the NMOSs 141-2, 141-3, 141-4, 142-2 and 142-3 are turned off and the NMOSs 131-2 and 131-3 are turned on, so that the unselected column lines 102-2 and 102-3 and the bit line 101-2 is at GND level. The selected column line 102-1 is electrically connected with a bias bus 180 since the NMOS 142-1 is turned on, so that the potential level thereof becomes as high as the output voltage 1.5 V of the inner voltage regulator circuit 160. The selected bit line 101-1 is electrically connected with the data bus 170-1 since the NMOS 141-1 is turned on. As a result, the potential of the data bus 170-1 is as high as the input voltage 0.1 V of the sense amplifier circuit 150-1. The sense amplifier circuit 150-1 detects data which has been written in the memory cell 104-11 by the current generated by the memory cell 104-11. Since there is a voltage of 0.1 V between the source and drain of the memory cell 104-12 on the same row selecting line adjoining to the memory cell 104-11, there exists a leak current due to the data written in the memory cell 104-12. The leak current, however, does not cause any trouble since the voltage between the source and drain of the unselected memory cell is about 0.1 V and the leak current can be set lower than 1/10 of the selected memory cell even if the floating potential 0.1 V at the source of the selected memory cell is taken into consideration.

The selected memory cell 104-01 supplies current to the sense amplifier circuit 150-1 by way of the NMOS 141-1. The sense amplifier circuit 150-1 converts the current supplied thereto into a voltage and amplifies the voltage to apply the same to the output node N 155.

Next, in case the column selection signal $Y_1$ goes GND level and $Y_2$ goes $V_{cc}$ level for reading out data from the memory cell 104-12, the selected column line 102-2 becomes in potential as high as the output potential 1.5 V of the inner voltage regulator circuit 160 since the NMOS 142-2 is turned on and the NMOS 131-2 is turned off. The unselected column line 102-1 is at the potential when it is not selected, i.e., GND level since the NMOS 131-1 is turned on and the NMOS 142-1 is turned off. Since the NMOS 141-1 is turned off and the NMOS 141-2 is turned on, the bit line 101-1 is electrically connected with the sense amplifier circuit 150-1 and the data stored in the selected memory cell 104-12 is read out to the bit line 101-1. In this case, since the data stored in the memory cell 104-11 and that stored in the memory cell 104-12 are the same with each other, the states of the selected bit line 101-1 and the sense amplifier circuit 150-1 remain unchanged.

Then a case where the row selection signal $X_0$ and the column selection signal $Y_1$ go $V_{cc}$ level and the row selection signals $X_1$ to $X_n$ and the column selection signals $Y_2$ and $Y_3$ go GND level so that the operation steps forwards to reading data in the memory cell 104-01 will be described hereinafter. Since the NMOS 142-1 is turned on and the inverse signal $\overline{Y}_1$ of the column selection signal $Y_1$ is at GND level so that the NMOS 131-1 is turned off, the selected column line 102-1 is electrically connected with the output of the inner voltage regulator circuit 160 to be 1.5 V in potential. Since the NMOS 142-2 is turned off and $\overline{Y}_2$ is at $V_{cc}$ level so that the NMOS 131-2 is turned on, the potential of the unselected column line 102-2 is at GND level. Since the threshold value $V_\tau$ of the selected memory cell 104-01 is higher than the $V_{cc}$ level, the bit line 101-1 which no longer receive current passing from the memory cells thereto shifts to the potential of "L" level at the time of reading data.

A case where the control signal $\overline{CE}$ is at "H" level, i.e., a standby state will be described hereinafter. At the standby state the row selection signals $X_0$ to $X_n$ and the column selection signals $Y_1$ to $Y_3$ are at GND level. It is not always a necessary condition, but it is enough that either of the row or column selection signals are all at GND level so that there is no current between the source and drain of all the memory cells. The inverse signals $\overline{Y}_1$, $\overline{Y}_2$ and $\overline{Y}_3$ off the column selection signals go all $V_{cc}$ level. In a standby state the PMOS 161 is turned off and the NMOS 162 is turned on so that the N 164 is at GND level and the NMOS 165 is turned off. As a result, the output of the inner voltage regulator circuit 160 goes GND level due to the high resistant element 167, so that, there is no D/C consumption in the circuit. Since the control signal $\overline{CE}$ is at $V_{cc}$ level also in the sense amplifier circuit 150-1, there is no current directly passing from the power source $V_{cc}$ to GND. The sense input N 154 goes GND level by way of the resistor element 153. When the control signal $\overline{CE}$ goes GND level and the ROM circuit is switched to an operating state, the sense amplifier circuit 150 shifts to a stable state. Since the state where the sense input is 0.1 V is a stationary state, the sense amplifier circuit 150-1 charges the data bus 170-1 and a selected bit line with electricity to be 0.1 V in potential. The sense amplifier circuit 150-1, the data bus 170-1 and the selected bit line are ready to read out the data from the selected memory cell instantly after they are in an operating state.

The N 164 of the inner voltage regulator circuit 160 goes $V_{cc}$ level instantly after the control signal $\overline{CE}$ goes "L" level, and starts charging the bias bus 180 with electricity to be 1.5 V in potential by way of the NMOS 165. It is possible to charge the bias bus 180 instantly up to 1.5 V in potential since the load of the inner voltage regulator circuit 160 is the selected column line alone when the inner voltage regulator circuit 160 is switched from a standby state to an operating state.

As described above, it is possible to realize a high-speed data reading without flowing direct current at all in the standby state according to the present invention.

A second embodiment of the present invention will be described with reference to FIG. 3. In FIG. 3, same elements illustrated in FIG. 1 are denoted at same numerals. The functions thereof are easily understandable from the above description.

Figure 3:
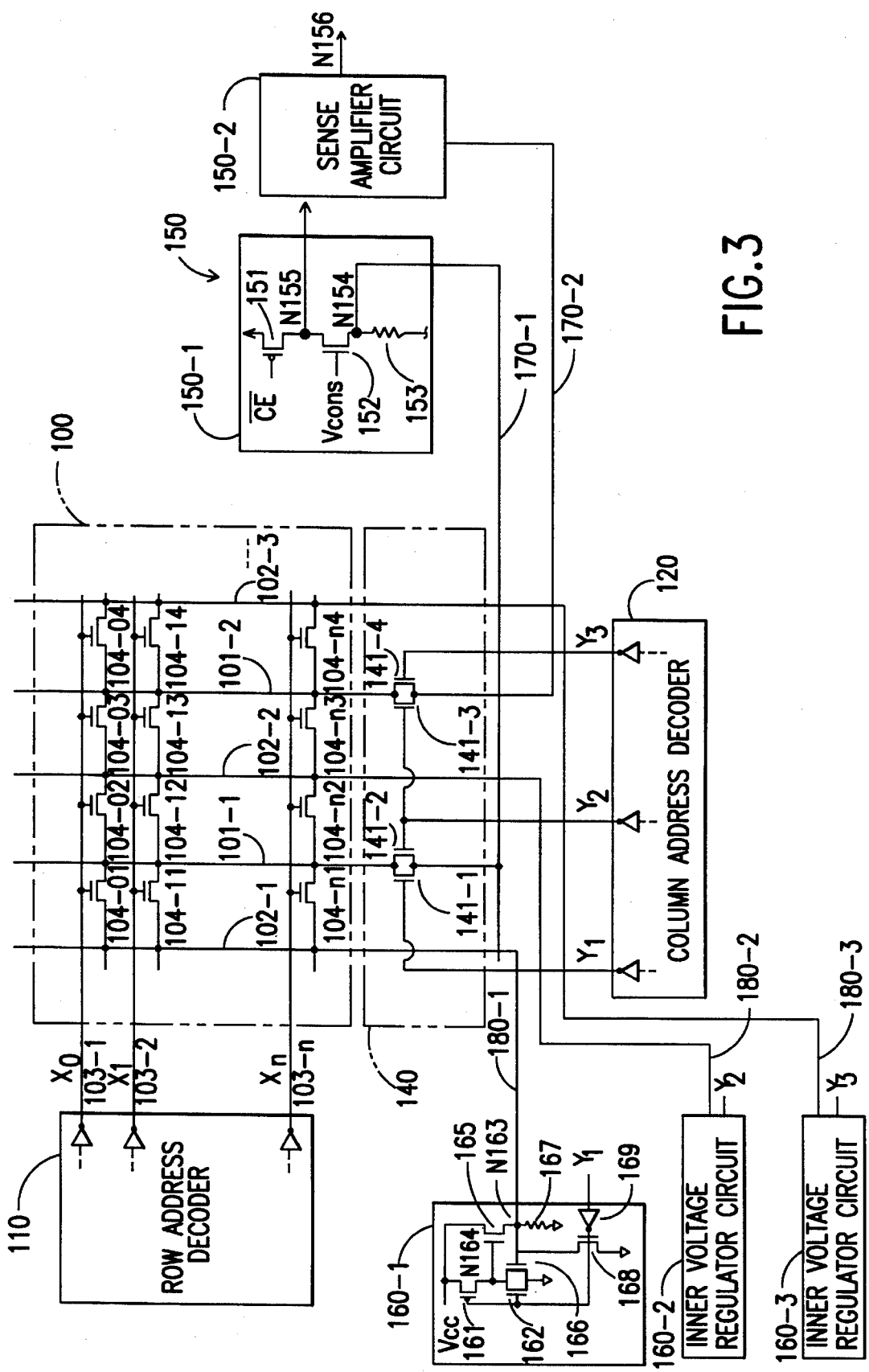
FIG. 3 is a block diagram of a ROM circuit according to a second embodiment of the present invention.

In a ROM circuit illustrated in FIG. 3, the column lines 102-1, 102-2 and 102-3 are coupled to the inner voltage regulator circuits 160-1, 160-2 and 160-3 by way of bias buses 180-1, 180-2 and 180-3 respectively.

The column address selection signals $Y_1$, $Y_2$ and $Y_3$ are supplied to the inner voltage regulator circuits 160-1, 160-2 and 160-3 respectively. These inner voltage regulator circuits are the same with one another in arrangement, so the inner voltage regulator circuit 160-1 will be described hereinafter representing them.

The inner voltage regulator circuit 160-1 is composed of the inner voltage regulator circuit 160 illustrated in FIG. 1 and the following element attached thereto as evident from FIG. 3.

It is an NMOS 168 which is coupled to the output node N 163 at the drain thereof and to GND at the source thereof and the gate of which receives the column address selection signal $Y_1$ by way of an inverter 169. Moreover, the gate thereof is coupled to the gates of the PMOS 161 and NMOS 162, i.e., the input terminal of the CMOS inverter. The inner voltage regulator circuits 160-2 and 160-3 are the same as the inner voltage regulator circuit 160-1 in arrangement.

At that time, the multiplexer 140 is composed of the NMOSs 141-1 to 141-4 so that the NMOSs 142-1 to 142-3 illustrated in FIG. 1 can be omitted.

The bit lines 101-1 and 101-2 are coupled to the data buses 170-1 and 170-2 by way of the multiplexer 140 and a sense amplifier circuit 150 is coupled to the data buses 170-1 and 170-2.

If the ROM circuit is so designed that the column selection signal goes GND when the control signal $\overline{CE}$ is at "H" level, It operates in the quite same way as that in the first embodiment. That is, all the outputs of the inner voltage regulator circuit 160 go GND level in response to the column selection signal at GND level in the standby state. When the standby state is changed to the operating state, the inner voltage regulator circuit 160 set forth above selectively produces 1.5 V to make the potential of the selected column line 1.5 V. When a current corresponding to the data written in the memory cell from the inner voltage regulator circuit to the selected bit line by way of the selected memory cell, the sense amplifier circuit converts the current into voltage to produce an amplified voltage.

Figure 4:
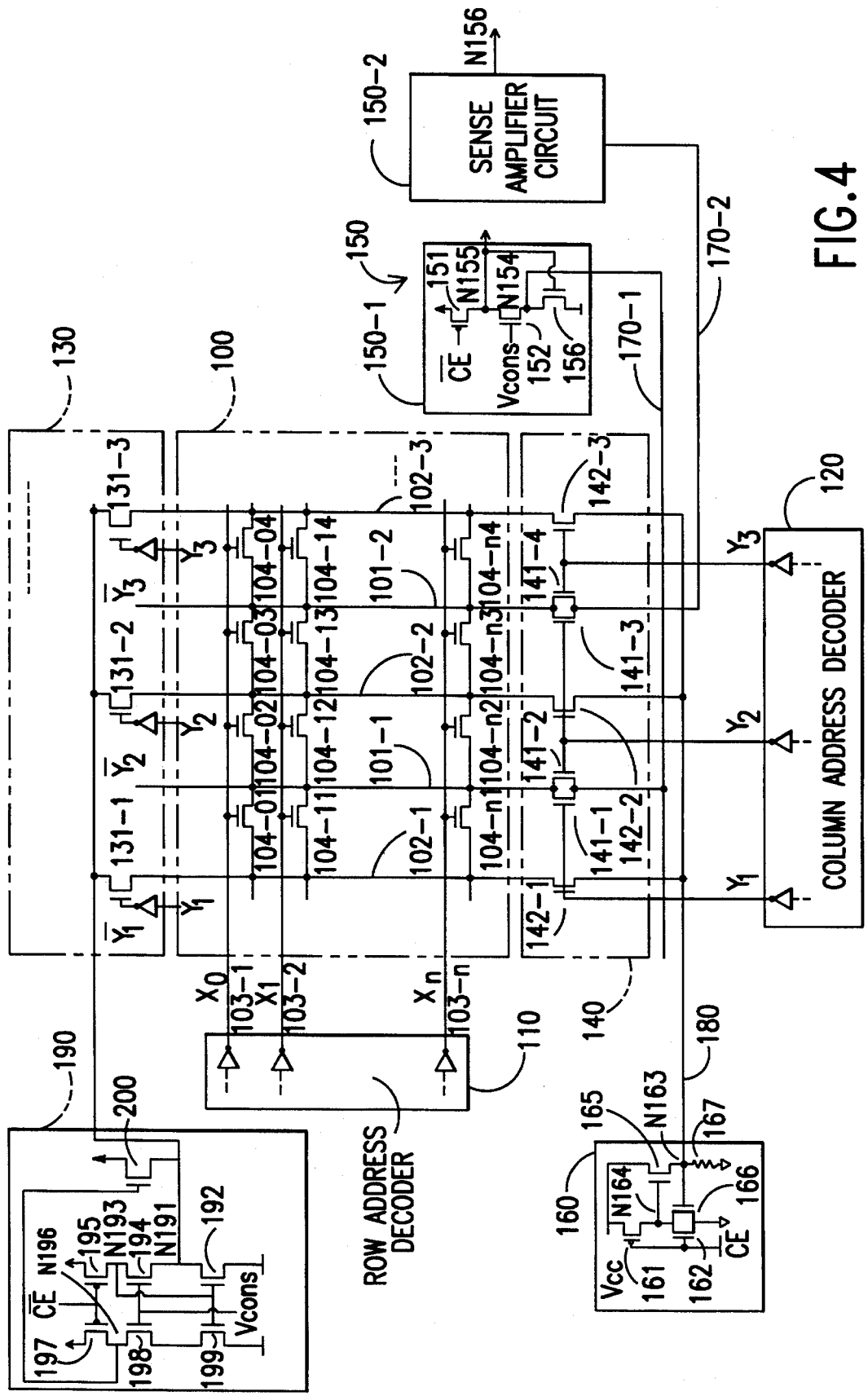

A third embodiment of the present invention will be described with reference to FIG. 4. In FIG. 4, the same elements as those illustrated in FIG. 1 are denoted at same numerals. The functions thereof are easily understandable from the description set forth above.

In the embodiment, an NMOS 156 is provided between the node N 154 and GND instead of the resistor element 153 off the sense amplifier circuit 150. The NMOS 156 is coupled to the node N 155 at the gate thereof. With this arrangement, the On-state resistance of the NMOS 156 (the resistance value of the NMOS 156 when it is turned on) is increased when the potential of the node N 155 drops. It is decreased when the potential of the node N 155 rises. As a result, a negative feedback is applied to the output of the sense amplifier circuit. Accordingly, the amplitude of the input power is made small, so that it is possible to perform a high-speed data reading.

In this embodiment, a potential supply circuit 190 is provided for applying a potential substantially as high as the input level (0.1 V) of the sense amplifier circuit to unselected column lines.

The potential supply circuit 190 comprises a node N 191 which is coupled to the sources of the NMOSs 131-1, 131-2 and 131-3 in the pull-down circuit 130 illustrated in FIG. 1. The circuit 190 is composed of the following elements: an NMOS 192 which is coupled to GND at the source thereof, to the node N 191 at the drain thereof and to the node N 193 at the gate thereof;

an NMOS 194 which is coupled to the node N 191 at the source thereof, to the node N 193 at the drain thereof and to the power source $V_{cons}$ for supplying a constant voltage at the gate thereof;

a PMOS 195 which is coupled to the power source $V_{cc}$ at the source thereof, to the node N 193 at the drain thereof and the gate of which receives the inner control signal $\overline{CE}$;

an NMOS 198 which is coupled to the node N 196 at the drain thereof and to the power source $V_{const}$ at the gate thereof;

an NMOS 199 which is coupled to GND at the source thereof, to the source of the NMOS 198 at the drain thereof and to the node N 193 at the gate thereof; and an NMOS 200 which is coupled to the node N 191 at the source thereof, to the power source $V_{cc}$ at the drain thereof and to the node N 196 at the gate thereof.

As evident from the figure, the potential supplying circuit 190 is the same as the sense amplifier circuit 150 in circuit arrangement. With the arrangement, it is possible to allow the operating level of the potential supply circuit 190 to conform to the sense input level (0.1 V) of the sense amplifier circuit. That is, when the potential of the node N 191 drops from the sense input level (0.1 V) a little, the drop of the potential is amplified and appears at the node 193. When the node 193 drops in potential, the NMOS 199 is turned off. As a result, the node 196 rises in potential. In response to the rise of potential, the NMOS 200 is turned on. The NMOS 200 supplies current until the potential of the node 191 reaches the sense input level. When the current is supplied excessively even a little, the potential of the node N 193 rises. As a result, the NMOS 199 is turned on and the potential of the node 196 drops so that the NMOS 200 is turned off to stop the supply of current.

In case the potential of the node N 191 rises higher than the sense input level, a potential which is amplified by the NMOS 194 appears at the node N 193. As a result, the On-state resistance of the NMOS 192 is reduced. Accordingly, the potential of the node N 191 rapidly returns to the sense input level.

As described above, an inverter having a charging ability and the NMOSs are combined with the sense amplifier circuit (150) having a sufficient discharging ability according to this embodiment. As a result, it is possible to set the potential of the node N 191 close to the sense input level, so that the leak current of the unselected memory cells are eliminated so as to attain an operating margin in a wide power source voltage operating range.

In the standby state, i.e., when the inner control signal $\overline{CE}$ is at "L" level, the potential supply circuit 190 does not supply current at all.

When the standby state is switched to the operating state, the potential of the node N 191 instantly shifts to the sense input potential as described above.

The operation of the ROM circuit according to this embodiment is more understandable than that in the preceding embodiment since it is fundamentally the same as that in the first embodiment set forth above.

The potential supply circuit 190 is not limited to the arrangement described in this embodiment since the similar function can be obtained by comprising the minimum number of minimum circuit units of transistors coupled between the power source $V_{cc}$ and GND in series in the sense amplifier circuit.

INDUSTRIAL UTILIZATION

The present invention can be applicable to a semiconductor storage device, particularly to a read-only memory circuit (ROM circuit).

It is possible to perform a high-speed data reading with low power consumption and provide a circuit for realizing it according to the present invention.

More concretely, it is possible to realize a low power consumption by reading data according to a method described in the first embodiment of the present invention, since the potential is applied to the selected column and bit lines alone.

Moreover, it is also possible to realize a high integration of circuit since the ROM circuit is provided with the sense amplifier circuit set forth above for applying a potential to the selected bit line.

Furthermore, if the ROM circuit is provided with the circuit explained in the second embodiment, the pull-down circuit illustrated in FIG. 1 can be omitted and the arrangement of the multiplexer 140 can be simplified, so that the ROM circuit can be more freely designed about the memory matrix where various circuits densely and complicatedly aggregates.

Still furthermore, if the ROM circuit is provided with the circuit described in the third embodiment, the potential of the column line instantly becomes the sense input potential when a column line is selected by the column selection signal, so that it is possible to realize a more high-speed ROM circuit.

There is no unavailable current pass in case the ROM circuit is in a standby state in any embodiment of the present invention.

Accordingly, the low power consumption can be realized as described above.

I claim:

1. A method of reading data comprising the steps of selecting a given column line and a bit line which adjoins to said column line among a plurality of column and bit lines in response to a column selection signal, selecting a given row line among a plurality of row lines in response to a row selection signal, and reading out data which is stored in a memory cell connected to said given column and row lines to said selected bit line; characterized in that data is read out from said memory cell by setting said given column line at a first potential level and almost at the same time setting said selected bit line at a second potential level which is lower than said first potential level and setting unselected column lines at a third potential level which is equal to or lower than said second potential level.

2. A method of reading data according to claim 1, characterized in that said first potential level is the potential level of a power source, said second potential level is the sense input potential level of a sense amplifier circuit for amplifying the potential of data which is read out to said bit line and said third potential level is the ground potential level.

3. A method of reading data according to claim 1, characterized in that said first potential level is the potential level of a power source, said second potential level is the sense input potential level of a sense amplifier circuit for amplifying the potential of data which is read out to said bit line and said third potential level is substantially said sense input potential level.

4. A method of reading data for a read-only memory circuit comprising the steps of selecting a first column line and a first bit line which adjoins to said first column line among said first and a second column lines for reading out data which is stored in a memory cell coupled to said first column line and said first bit line based on the voltage between said first column and first bit lines to said first bit line upon reception of a selection signal; characterized in that data is read out from said memory cell by setting said first column line at a first potential level and almost at the same time setting said first bit line at a second potential level which is lower than said first potential level and setting said second column line at a third potential which is equal to or lower than said second potential.

5. A method of reading data for a read-only memory circuit according to claim 4, characterized in that said first potential level is the potential level of a power source, said second potential level is the sense input potential level of a sense amplifier circuit for amplifying data which is read out to said bit line and said third potential level is the ground potential level.

6. A method of reading data for a read-only memory circuit according to claim 4, characterized in that said first potential level is the potential level of a power source, said second potential level is the sense input potential level of a sense amplifier circuit for amplifying data which is read out to said bit line and said third potential level is substantially said sense input potential level.

7. A read-only memory circuit comprising:

a plurality of column lines;

a plurality of bit lines arranged with said column lines in turns in parallel thereto;

a plurality of row lines arranged substantially at right angles to said bit and column lines;

a plurality of memory cells for storing data therein, each memory cell having a control terminal coupled to one of said row lines and being coupled between each column line and each bit line;

a row selection circuit for selecting a given row line among said plural row lines;

a column selection circuit for selecting a given column line among said plural column lines and a bit line which adjoins to said given column line to read out data which is stored in a memory cell connected to said given row and column lines to selected bit line;

a first potential supply circuit for applying a first potential to said selected column line;

a second potential supply circuit for applying a second potential which is lower than said first potential to said selected bit line; and a third potential supply circuit for applying a third potential which is equal to or lower than said second potential to unselected column lines.

8. The memory circuit according to claim 7, wherein said second potential supply circuit supplies said second potential to said bit line and thereafter amplifies a potential of said data read out to said bit line to output the same from an output node.

9. The memory circuit according to claim 8, wherein said second potential supply circuit is composed of a p-channel MOS transistor which is coupled to a driving power source at the source thereof and to said output node at the drain thereof and the gate of which receives a control signal;

a first n-channel MOS transistor which is coupled to said bit line at the source thereof and said output node at the drain thereof and the gate of which receives a constant voltage; and a second n-channel MOS transistor which is coupled to ground at the source thereof, to said bit line at the drain thereof and to said output node at the gate thereof.

10. A read-only memory circuit according to claim 9, wherein said third potential supply circuit is similar to said second potential supply circuit in arrangement and supplies said third potential to said unselected column lines in response to the selection of said given column line.

11. A read-only memory circuit characterized in comprising:

a first and a second column lines;

a first bit line arranged between said first and second column lines;

a first memory cell for storing a first data therein which is coupled between said first column line and said first bit line;

a second memory cell for storing a second data therein which is coupled between said second column line and said first bit line;

a column selection circuit which selects said first column line and said first bit line and supplies said first data to said first bit line based on the voltage between said first column line and said first bit line;

a first potential supply circuit for applying a first potential to said first column line;

a second potential supply circuit for applying a second potential which is lower than said first potential to said first bit line; and a third potential supply circuit for applying a third potential which is equal to or lower than said second potential to said second column line.

12. The memory circuit according to claim 11, wherein said second potential supply circuit supplies said second potential to said bit line and thereafter amplifies a potential corresponding to said data read out to said bit line to output the same from an output node.

13. The memory circuit according to claim 12, wherein said second potential supply circuit is composed of:

a p-channel MOS transistor which is coupled to a driving power source at the source thereof and to said output node at the drain thereof and the gate of which receives a control signal;

a first n-channel MOS transistor which is coupled to said bit line at the source thereof and to said output node at the drain thereof and the gate of which receives a constant voltage; and a second n-channel MOS transistor which is coupled to the ground at the source thereof, to said bit line at the drain thereof and to said output node at the gate thereof.

14. A read-only memory circuit according to claim 13, wherein said third potential supply circuit is similar to said second potential supply circuit in arrangement and supplies said third potential to said unselected column lines in response to the selection of said given column line.

* * * * *